(12) United States Patent  (10) Patent No.: US 7,396,621 B2
Fujisawa et al.  (45) Date of Patent: *Jul. 8, 2008

(54) EXPOSURE CONTROL METHOD AND METHOD OF MANUFACTURING A SEMICONDUCTOR DEVICE

(75) Inventors: Tadahito Fujisawa, Tokyo (JP); Soichi Inoue, Yokohama (JP); Satoshi Tanaka, Kawasaki (JP); Masafumi Asano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/819,375

(22) Filed: Jun. 27, 2007

(65) Prior Publication Data

US 2007/0259280 A1 Nov. 8, 2007

Related U.S. Application Data

(62) Division of application No. 10/874,192, filed on Jun. 24, 2004.

(30) Foreign Application Priority Data

Jun. 26, 2003 (JP) .............................. 2003-182452

(51) Int. Cl.
*G03F 7/16* (2006.01)
*G03F 7/20* (2006.01)
*G03F 7/38* (2006.01)
*G03F 1/14* (2006.01)

(52) U.S. Cl. .............................. 430/30; 430/5; 430/311; 430/327; 430/330

(58) Field of Classification Search .................... 430/30
See application file for complete search history.

(56) References Cited

U.S. PATENT DOCUMENTS 6,226,074 B1  5/2001  Fujisawa et al.
6,251,544 B1  6/2001  Inoue et al.

(Continued)

OTHER PUBLICATIONS

Starikov, A., "Exposure Monitor Structure", SPIE vol. 1261 Integrated Circuit Metrology, Inspection, and Process Control IV, (1990), pp. 315-324.

*Primary Examiner*—Mark F. Huff
*Assistant Examiner*—John Ruggles
(74) *Attorney, Agent, or Firm*—Finnegan, Henderson, Farabow, Garrett & Dunner L.L.P.

(57) ABSTRACT

A method of manufacturing a semiconductor device includes preparing a projection exposure apparatus and a photomask, the photomask having a transparent substrate and a light shield film arranged in patterns to be transferred to a resist film on a wafer. The patterns include a circuit mask pattern, and first and second mark mask patterns having dimensions which change in accordance with exposure of the resist film. The method further includes forming first and second exposure monitor marks by causing phasing differences of 180 degrees and zero degrees, respectively, of light passing through the corresponding first and second mark mask patterns; measuring the first and second exposure monitor marks; calculating first and second effective exposures based on measured dimensions of the first and second exposure monitor marks; comparing variations of the first and second effective exposures; and changing at least one of a deposit condition of a front-end film formed under the resist film or a resist film coating condition if a variation of the first effective exposure differs from a variation of the second effective exposure.

5 Claims, 7 Drawing Sheets

U.S. PATENT DOCUMENTS

| | | |
|---|---|---|
| 6,376,139 B1 | 4/2002 | Fujisawa et al. |
| 6,667,139 B2 | 12/2003 | Fujisawa et al. |
| 6,866,976 B2 * | 3/2005 | Asano et al. ............... 430/30 |
| 6,919,153 B2 * | 7/2005 | Fujisawa et al. ............ 430/30 |
| 7,175,943 B2 * | 2/2007 | Asano et al. ............... 430/5 |
| 2002/0034695 A1 * | 3/2002 | Kikuchi ............... 430/5 |
| 2004/0058256 A1 | 3/2004 | Fujisawa et al. |
| 2004/0265713 A1 * | 12/2004 | Shiobara et al. ............ 430/30 |
| 2005/0008979 A1 * | 1/2005 | Hayasaki et al. ............ 430/30 |
| 2005/0048378 A1 * | 3/2005 | Sato et al. ............... 430/5 |
| 2007/0105028 A1 * | 5/2007 | Asano et al. ............... 430/5 |

* cited by examiner

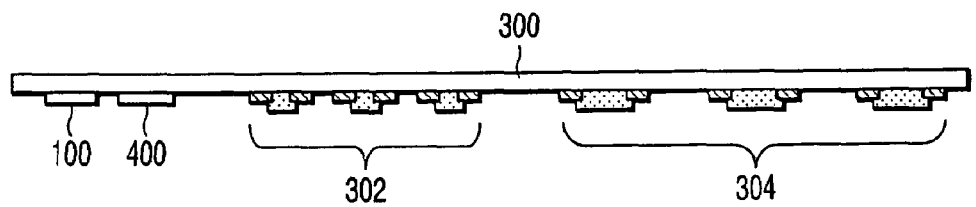
F I G. 14
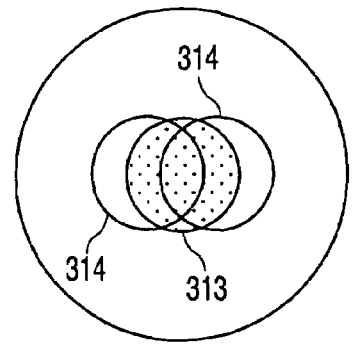
F I G. 15
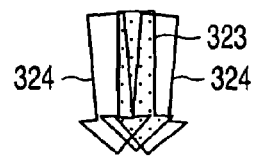
F I G. 16
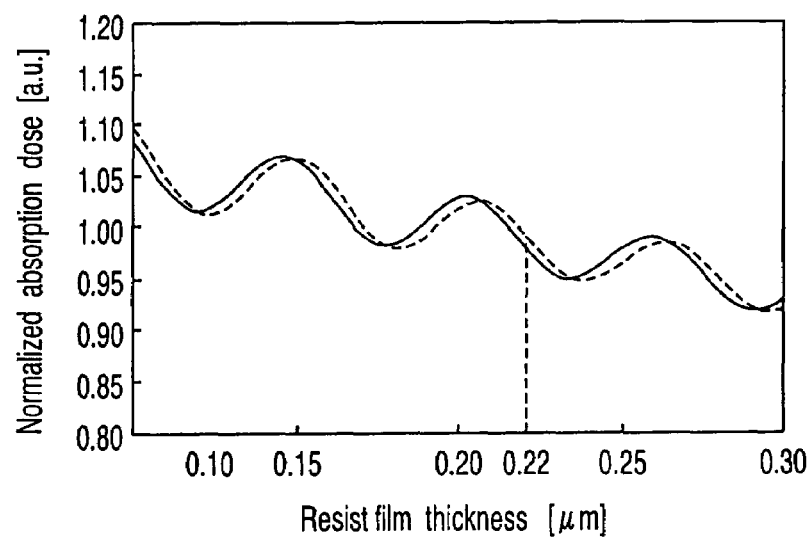
F I G. 17

EXPOSURE CONTROL METHOD AND METHOD OF MANUFACTURING A SEMICONDUCTOR DEVICE

CROSS-REFERENCE TO RELATED APPLICATIONS

This application is a divisional Application of application Ser. No. 10/874,192, filed Jun. 24, 2004, which is based upon and claims the benefit of priority from the prior Japanese Patent Application No. 2003-182452, filed Jun. 26, 2003. The entire contents of these applications are incorporated herein by reference in their entirety.

BACKGROUND OF THE INVENTION

1. Field of the Invention

The present invention relates to a semiconductor lithography technique. In particular, the present invention relates to an exposure monitor mask for highly accurately monitoring an effective exposure value to obtain the maximum exposure margin. Further, the present invention relates to an exposure control method, and a method of manufacturing a semiconductor device using the foregoing exposure monitor mask.

2. Description of the Related Art

Short wavelength of exposure wavelength and high NA of projection lens have been required with the scale down of patterns, and simultaneously, the process improvement has been made. However, the requirements of the scale down of device patterns are becoming recently stricter. It is difficult to sufficiently obtain a degree of freedom of exposure and an exposure margin of the depth of focus; as a result, the yield is reduced. In order to effectively use less exposure margin to prevent the reduction of the yield, it is required to high-accurately control exposure and focus.

The exposure control method is usually determined by measuring a line width of pattern. However, the pattern line width varies depending on not only exposure but also focus. The scale down of patterns further advances, and thereby, focus error largely affects the pattern line width. For this reason, it is difficult to determine whether the variation of the pattern line width result from variations of proper exposure value or focus position. Thus, the method of high accurately controlling the exposure is required.

Contrary, Starikov discloses the method of measuring an effective exposure receiving no influence by focus variations (Alexander Starikov, SPIE Vol. 1261 Integrated Circuit Metrology, Inspection, and Process Control IV (1990) p. 315). Starikov proposes a mask pattern for the exposure monitor mark such that the focus error gives no influence to the line width. According to the Starikov proposal, a block having a pattern width that is not resolved in a projection exposure apparatus (aligner) is used. The block is arranged to continuously vary a dimension ratio (duty ratio) of light transmission and shield portions of the pattern. By doing so, a mark having an irradiation gradient distribution, which does not depend on a focus state, is formed on a wafer. In other words, only zero-order diffracted light passing the vicinity of the center of the lens within the NA is focused in a diffracted light image of the mask pattern for the exposure monitor mark. By doing so, effective exposure is monitored without receiving the influence by defocus.

The scale down further advances, and in addition, a process of using an alternating phase shift mask increases. For this reason, when the mask pattern for the exposure monitor mark is formed in the alternating phase shift mask, there are new problems, which do not so far arise in normal binary mask or half-tone phase shift mask.

When the normal binary mask or half-tone phase shift mask is used, diffracted light is generated from mask pattern corresponding to device pattern to be monitored on the mask. In the diffracted light, zero-order and± first-order diffracted light contributes to image formation (imaging) on the wafer. The diffracted light strength has a relation of zero order ≧± first order. The± first-order diffracted light has shading portions at the edge portion of pupil. For this reason, the zero-order diffracted light largely contributes as exposure. The exposure monitor mark is formed by the mask pattern for the exposure monitor mark in which only zero-order diffracted light is projected on the wafer. Thus, the dimension of the exposure monitor mark is measured to calculate variations of the effective exposure. From the calculated variations, the variations described below are high accurately monitored. One is an exposure apparatus dose variation. Another is post exposure bake (PEB) temperature variation and PEB time variation. Another is a resist sensitivity variation. Another is an effective exposure variation by the change of resist or front-end film thickness resulting from standing wave effect.

However, in the alternating phase shift mask, no zero-order diffracted light of the lens of actual device mask pattern is generated due to alternating phase shift effect. The foregoing± first-order diffracted light forms a latent image of the actual device pattern. A conventional exposure monitor mark is formed by only zero-order diffracted light passing the vicinity of the center of the projection lens. The incident angle onto the resist film is different between diffracted light for forming the latent image of the exposure monitor mark and the latent image of the actual device pattern.

As a result, if the effective exposure variation is monitored using the exposure mask mark, it is possible to monitor variations resulting from of the foregoing exposure apparatus dose, PEB temperature and PEB time. However, in the variation resulting from the foregoing resist or front-end film thickness variation, the incident angle onto the resist is largely different in formation between the mask pattern for the exposure monitor mark and actual pattern. For this reason, the influence by standing wave effect is different; therefore, the effective exposure with respect to the actual pattern is not monitored highly accurately.

BRIEF SUMMARY OF THE INVENTION

According to one aspect of the present invention, there is provided a mask including a transparent substrate transparent to exposure light and a light shield film formed on the transparent substrate, and formed with an exposure monitor mark for monitoring exposure when transferring a circuit pattern on the mask to a resist formed on a wafer by a projection exposure apparatus, the exposure monitor mark being formed in a manner that blocks having a predetermined width p, which are not resolved by the projection exposure apparatus, are intermittently or continuously arrayed along one direction, light shield and transmission portions are arrayed along one direction in each of the blocks, the blocks are arrayed so that a dimension ratio of the light shield and transmission portions of the blocks simply changes and a phase difference of exposure light passing through adjacent light transmission portions is approximately 180°.

According to one aspect of the present invention, there is provided an exposure control method comprising: preparing a projection exposure apparatus; preparing a photomask which including a transparent substrate, and a light shield film which having patterns to be transferred to a resist film formed on a wafer by the projection exposure apparatus formed on the transparent substrate, the patterns including, a mask pattern for the target pattern to form a latent image predetermined pattern to the resist film, and a mask pattern for the exposure monitor mark to form an exposure monitor mark whose dimension changes in accordance with exposure to the resist film, the mask pattern for the exposure monitor mark being formed in a manner that blocks having a predetermined width p, which are not resolved by the projection exposure apparatus, are intermittently or continuously arrayed along one direction, light shield and transmission portions are arrayed along one direction in each of the blocks, the blocks are arrayed so that a dimension ratio of the light shield and transmission portions of the blocks simply changes and a phase difference of exposure light passing through adjacent light transmission portions is approximately 180°; transferring the mask pattern for the exposure monitor mark to the resist film using the projection exposure apparatus to form a latent image of the exposure monitor mark on the resist film; measuring a dimension of an exposure monitor mark obtained by developing the latent image of the exposure monitor mark and/or the resist film; calculating a difference between an optimum exposure value when transferring the pattern formed on the photomask to the resist film and an predetermined exposure value preset in the projection exposure apparatus based on the measurement result; and changing the predetermined exposure value in accordance with the calculated difference.

According to one aspect of the present invention, there is provided a method of manufacturing a semiconductor device, comprising: preparing a projection exposure apparatus; preparing a photomask which including a transparent substrate and, and a light shield film which having patterns to be transferred to a resist film formed on a wafer by the projection exposure apparatus formed on the transparent substrate, the patterns including, a mask pattern for circuit pattern to form a latent image of a predetermined circuit pattern to a resist film; and a mask pattern for the exposure monitor mark to form a latent image of an exposure monitor mark whose dimension changes in accordance with exposure to the resist film, the mask pattern for the exposure monitor mark being formed in a manner that blocks having a predetermined width p, which are not resolved by the projection exposure apparatus, are intermittently or continuously arrayed along one direction, light shield and transmission portions are arrayed along one direction in each of the blocks, the blocks are arrayed so that a dimension ratio of the light shield and transmission portions of the blocks simply changes and a phase difference of exposure light passing through adjacent light transmission portions is approximately 180°; transferring the mask pattern for the exposure monitor mark to the resist film using the projection exposure apparatus to form a latent image of the exposure monitor mark on the resist film; measuring a dimension of an exposure monitor mark obtained by developing the latent image of the exposure monitor mark and/or the resist film; calculating a difference between an optimum exposure value when transferring the pattern formed on the photomask to the resist film and an predetermined exposure value preset in the projection exposure apparatus based on the measurement result; and changing at least one of exposure of the projection exposure apparatus, heat treatment time in a heat process after exposure, heat treatment temperature in the heat process, development time in a development process, developer temperature or developer concentration in accordance with the calculated difference.

According to one aspect of the present invention, there is provided a method of manufacturing a semiconductor device, comprising: preparing a projection exposure apparatus; preparing a photomask which including a transparent substrate and, and a light shield film which having patterns to be transferred to a resist film formed on a wafer by the projection exposure apparatus formed on the transparent substrate, the patterns including, a mask pattern for circuit pattern to form a latent image of a predetermined circuit pattern to a resist film; and first and second mask patterns for the exposure monitor mark to form each latent image of exposure monitor mark whose dimension changes in accordance with exposure to the resist film, the first mask pattern for the exposure monitor mark being formed in a manner that first blocks having a predetermined width p, which are not resolved by the projection exposure apparatus, are intermittently or continuously arrayed along one direction, first light shield and transmission portions are arrayed along one direction in each of the first blocks, the first blocks are arrayed so that a dimension ratio of the first light shield and transmission portions of the first blocks simply changes and a phase difference of exposure light passing through adjacent first light transmission portions is approximately 180°, the second mask pattern for the exposure monitor mark being formed in a manner that second blocks having a predetermined width p, which are not resolved by the projection exposure apparatus, are intermittently or continuously arrayed along one direction, second light shield and transmission portions are arrayed along one direction in each of the second blocks, the second blocks are arrayed so that a dimension ratio of the second light shield and transmission portions of the second blocks simply changes and a phase difference of exposure light passing through adjacent second light transmission portions is approximately 0°; transferring the first and second mask patterns for the exposure monitor mark to the resist film using the projection exposure apparatus to form each latent image of the first and second exposure monitor marks on the resist film; measuring each dimension of the first and second exposure monitor marks obtained by developing the latent image of the first and second exposure monitor mark and/or the resist film; calculating a first effective exposure based on the dimension of the first exposure monitor mark; calculating a second effective exposure based on the dimension of the second exposure monitor mark; and changing at least one of deposit condition of a front-end formed under the resist film or resist film coating condition if the first and second effective exposure have a relation different from each other.

BRIEF DESCRIPTION OF THE SEVERAL VIEWS OF THE DRAWING

FIG. 14 is a cross-sectional view to explain the structure of a photomask according to a second embodiment of the present invention;

FIG. 15 is a view showing diffracted light images passing through a mask pattern for the exposure monitor mark and a 460-nm pitch phase shift target pattern according to the second embodiment;

FIG. 16 is a view showing diffracted light of the mask pattern for the exposure monitor mark and the 460-nm pitch phase shift target pattern;

FIG. 17 is a characteristic chart to explain resist film thickness dependency of absorption dose of the exposure monitor mark and the 460-nm pitch target pattern;

DETAILED DESCRIPTION OF THE INVENTION

Embodiments of the present invention will be described below with reference to the accompanying drawings.

First Embodiment

The first embodiment for solving the foregoing problem will be explained below.

The inventors have formed a conventional mask pattern for the exposure monitor mask in an alternating phase shift mask. In this case, it is impossible to monitor an effective exposure variation relevant to thickness variation of under-layer or resist film. For this reason, highly accurate critical dimension (CD) control is not achieved. The following method is given in order to solve the problem described above.

An ArF excimer laser projection exposure apparatus was used. In the projection exposure apparatus, the exposure wavelength λ is 193 nm, the numerical aperture NA on the wafer is 0.68, and the coherence factor σ is 0.34. The projection exposure apparatus is provided with an alternating photomask. The pattern formed on the alternating photomask is transferred to a positive resist film on a wafer. The details of the pattern at unnecessary edge portions peculiar to the alternating photomask are omitted here. In brief, the pattern at unnecessary edge portions is removed by carrying out double exposure after the pattern is transferred. The following is an explanation about an example applied to the case of forming a resist-remaining pattern having a pitch of 190 nm and a width of 80 nm as the dimension of a resist pattern (target pattern) formed on the wafer.

Figure 1:
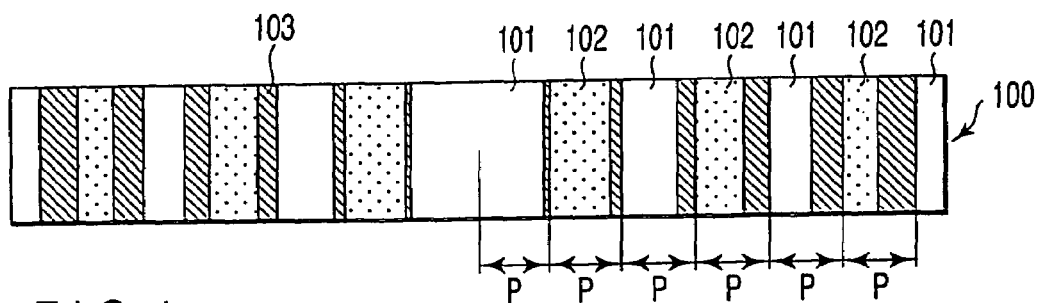
FIG. 1 is a top plan view schematically showing a mask pattern for the exposure monitor mark according to a first embodiment of the present invention.
Figure 2:
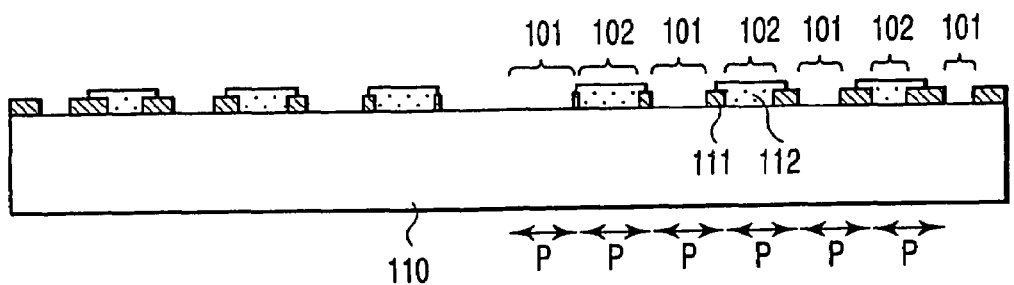
FIG. 2 is a cross-sectional view to explain the structure of a mask pattern for the exposure monitor mark according to the first embodiment.

FIG. 1 is a top plan view schematically showing a mask pattern for the exposure monitor mark according to a first embodiment of the present invention. FIG. 2 is a cross-sectional view to explain the structure of the mask pattern for the exposure monitor mark shown in FIG. 1.

As shown in FIG. 1 and FIG. 2, a mask pattern 100 for the exposure monitor mark is formed in a manner that a block having a width p is continuously arrayed. The block includes light transmission portions 101, 102 and a light shield portion 103. The selected width p is a dimension, which is not resolved by the used exposure apparatus (aligner). The foregoing light transmission portions 101, 102 and light shield portion 103 are arrayed along the arrangement direction of the block. The duty ratio of each block is set so that the duty ratio of the light transmission portions 101, 102 and the light shield portion 103 included in each arrayed block simply changes. Incidentally, several blocks may be intermittently arrayed.

In FIG. 2, a reference numeral 110 denotes a transparent substrate such as silica (quartz) glass, 111 denotes a light shield film, and 112 denotes a phase shifter (optical film). The thickness of the phase shifter 112 is adjusted as follows. Light transmitted through the transparent substrate 110 is shifted by an angle of 180° with respect to the phase of light transmitted through the transparent substrate 110 As illustrated in FIG. 2, the light transmission portion 101 is not formed with the phase shifter 112. On the other hand, the light transmission portion 102 is formed with the phase shifter 112.

When illumination light is irradiated on to the mask pattern for the exposure monitor mark, the following characteristic appears. That is, the intensity distribution of a diffracted light of the mask pattern for the exposure monitor mark on the substrate surface simply decreases or increases without depending on the focus position.

As described above, the phase of each light transmitted through adjacent light transmission portions is shifted by an angle of 180°. The phase shift mask pattern for the exposure monitor mark is used, and thereby, an exposure monitor mark is formed on the wafer surface. In this case, the zero-order diffracted light generated from the mask pattern for the exposure monitor mark is not projected on the resist film, like the mask pattern for the target pattern requiring dimension control in actual. In addition, the exposure monitor mark does not depend on focus by± first-order diffracted light.

Figure 3:
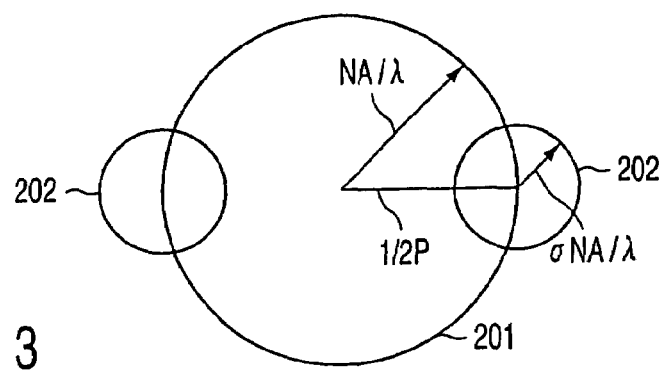
FIG. 3 is a view showing the pupil plane distribution of a diffracted light passing through the mask pattern for the exposure monitor mark according to the first embodiment.

As seen from the diffracted light image on the pupil plane shown in FIG. 3, the preferable condition described below is given. The condition is to obtain a diffraction angle wider than a state that the center of a± first-order diffracted light 202 overlaps the edge of a pupil plane 201 of a projection optical system of the exposure apparatus. Thus, the condition of the width p of the block, which is not resolved by the exposure apparatus, does not depend on the coherence factor σ. In order to prevent the block from being resolved by the exposure apparatus, the following requirement is set. More specifically, when an exposure monitor pattern is projected on to the resist film using the projection exposure apparatus, the width of the array direction of a projection image corresponding to the block is set as P. The width P is expressed by the following equation (1).

$$P \leq \lambda/2NA \quad (1)$$

In the mask pattern 100 for the exposure monitor mark, the width P is set to 140 nm to satisfy the foregoing equation (1).

The phase shift mask pattern for the exposure monitor mark designed in the foregoing manner is used. In this way, diffracted light images of the mask patterns for the target pattern and for the exposure monitor mark are formed at the position near to each other on the pupil plan of the projection optical system. Thus, the diffracted light image of the mask pattern for the exposure monitor mark reduces the influence by standing wave effect in which the diffracted light image of the mask patterns for the target pattern receives from thickness variation of the front-end film. The effect of the mask pattern for the exposure monitor mark will be explained below comparing with a conventional mask pattern for the exposure monitor mark.

Figure 4:
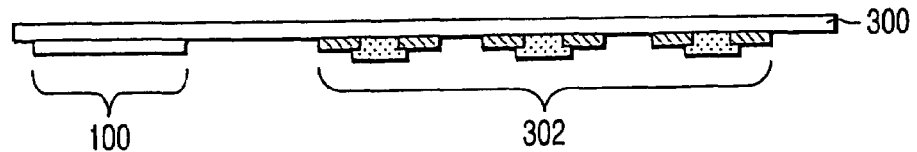
FIG. 4 is a cross-sectional view to explain the structure of a photomask according to the first embodiment.
Figure 5:
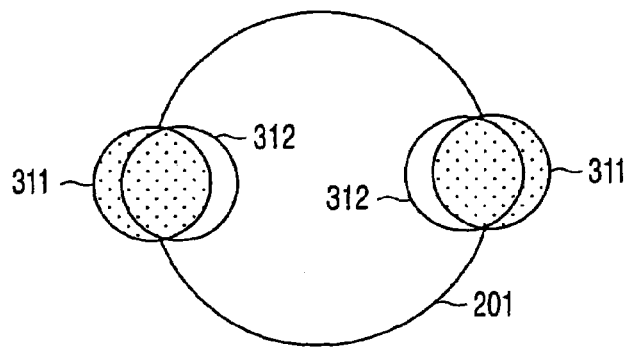
FIG. 5 is a plan view showing the pupil plane distribution of a diffracted light of the mask pattern for the exposure monitor mark according to the first embodiment.
Figure 6:
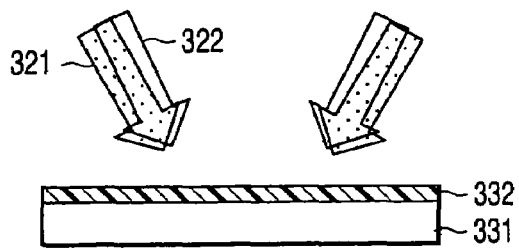
FIG. 6 is a view showing a diffracted light (zero-order diffracted light) passing through the mask pattern for the exposure monitor mark according to the first embodiment.

In FIG. 4 to FIG. 6, there are shown a mask pattern for the exposure monitor mark (width P=140 nm) according to the first embodiment and an alternating mask pattern for the target pattern having a pitch of 190 nm. That is, there are shown diffracted light images of the foregoing two mask patterns on the pupil plane of the projection optical system and incident states on the wafer surface. FIG. 4 is a cross-sectional view schematically showing the structure of a photomask. In FIG. 4, a reference numeral 300 denotes a transparent substrate, and 302 denotes a mask pattern for the target pattern.

In FIG. 5, there is shown a diffracted light image (+first-order diffracted light) 311 on the pupil plane 201 of the mask pattern 100 for the exposure monitor mark of the present embodiment. As depicted in FIG. 5, the diffracted light image 311 of the alternating mask pattern 100 for the exposure monitor mark of the embodiment and a diffracted light image 312 of the mask pattern 302 for the target pattern are projected. In this case, the foregoing two diffracted light images 311 and 312 are projected at nearly the same position on the pupil plane 201. FIG. 6 is a view to explain the incident angle on the wafer surface between diffracted light of the alternating mask pattern for the exposure monitor mark and the mask pattern for the target pattern. As seen from FIG. 6, the incident angle of the diffracted light 321 of the alternating mask pattern 100 for the exposure monitor mark is approximately the same as the diffracted light 322 of the mask pattern 302 for the target pattern.

Figure 7:
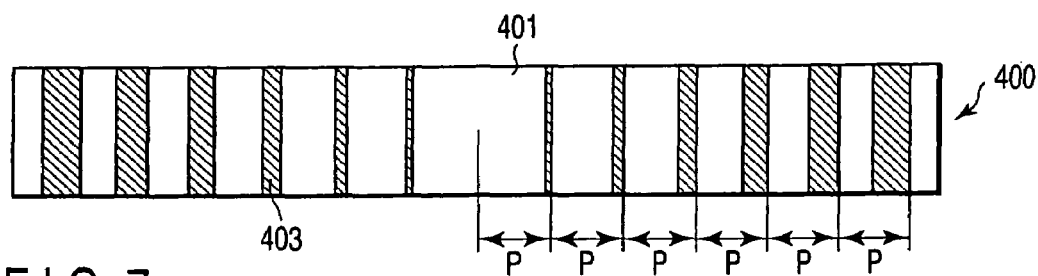
FIG. 7 is a view to explain a conventional mask pattern for the exposure monitor mark.
Figure 8:
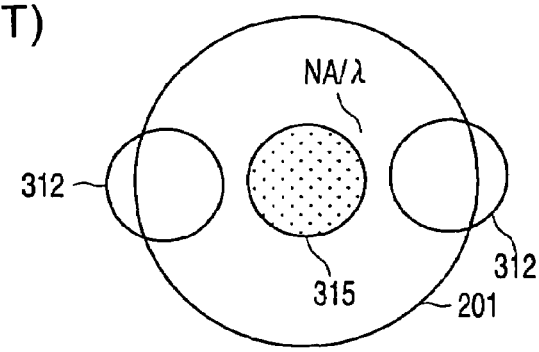
FIG. 8 is a view showing the pupil plane distribution of a diffracted light image (zero-order diffracted light) of a binary mask pattern for the exposure monitor mark.

Contrary, FIG. 7 shows a conventional binary mask pattern 400 for the exposure monitor mark. In FIG. 7, a reference numeral 401 denotes a light transmission portion, and 403 denotes a light shield portion. In FIG. 8, there is shown each position on the pupil plane of diffracted light images of mask patterns for the exposure monitor mark and target pattern. As illustrated in FIG. 8, a diffracted light image (zero-order light image) 315 of the binary mask pattern 400 for the exposure monitor mark and the diffracted light image 312 of the mask pattern 302 for the target pattern are projected. In this case, the foregoing two diffracted light images 315 and 312 are projected at the position different from each other on the pupil plane 201.

The binary mask pattern 400 for the exposure monitor mark is formed in a manner that a block having a predetermined width incapable of being resolved by the used exposure apparatus is continuously arrayed. In each block, light transmission and shield portions are arrayed along the arrangement direction of the block. The duty ratio of each block is set so that the duty ratio of light transmission and shield portions arrayed in each block simply changes. Incidentally, several blocks may be intermittently arrayed. The condition for preventing the block from being resolved by the exposure apparatus is expressed by the following equation.

$$\lambda/P' \geq (1+\sigma)NA$$

Where, P' is a width of the arrangement direction of the projected image corresponding to the block when exposure monitor pattern is projected on the resist film using the projection exposure apparatus.

Figure 9:
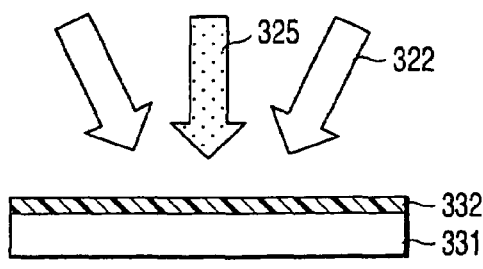
FIG. 9 is a view showing a diffracted light (zero-order diffracted light) of the conventional mask pattern for the exposure monitor mark.

FIG. 9 is a view to explain the incident angle on the wafer surface between a diffracted light 325 of the binary mask pattern for the exposure monitor mark and a diffracted light 322 of the mask pattern for the target pattern. In FIG. 9, a reference numeral 331 denotes a wafer, and 332 denotes a resist film. As seen from FIG. 9, the incident angle of the diffracted light 325 of the binary mask pattern 400 for the exposure monitor mark is quite different from the diffracted light 322 of the mask pattern 302 for the target pattern.

Figure 10:
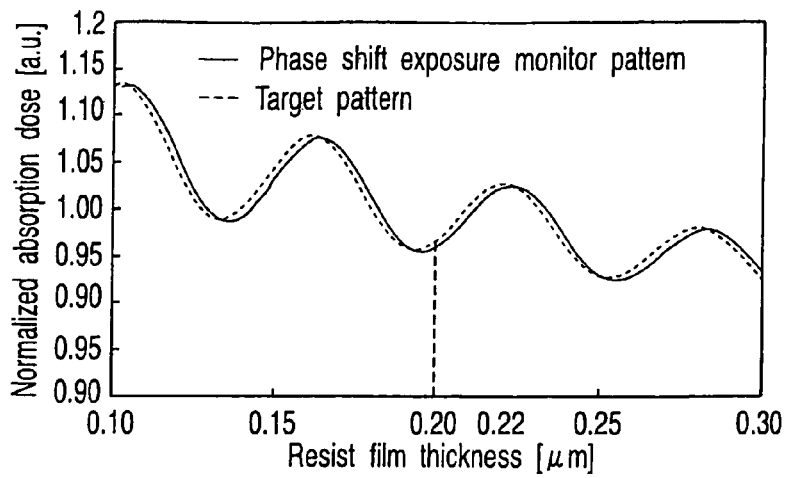
FIG. 10 is a characteristic chart to explain resist film thickness dependency of absorption dose of the exposure monitor mark according to the first embodiment and a target pattern.
Figure 11:
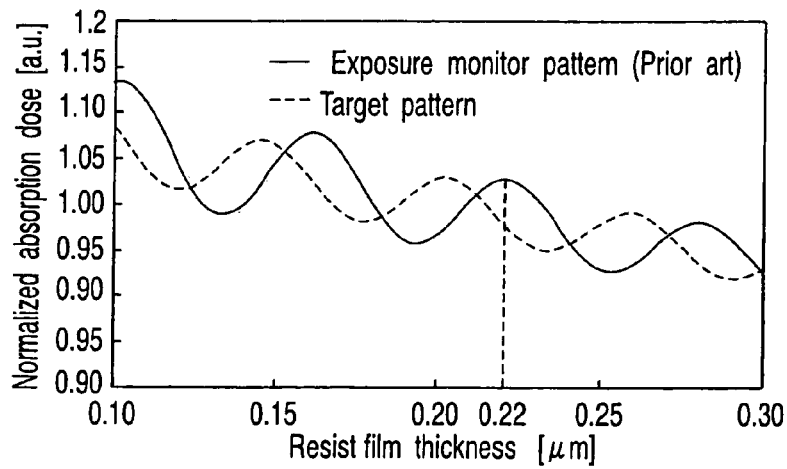
FIG. 11 is a characteristic chart to explain resist film thickness dependency of absorption dose of the conventional exposure monitor mark and a target pattern.

FIG. 10 is a characteristic chart to explain absorption dose with respect to the resist film in the phase shift mask pattern for the exposure monitor mark and the mask pattern for the target pattern. FIG. 11 is a characteristic chart to explain absorption dose with respect to the resist film in the binary mask pattern for the exposure monitor mark and the mask pattern for the target pattern. A resist film, oxide film (110 nm), organic anti-reflection film (300 nm) and Si are used as the front-end film. Judging from the result, the absorption dose characteristic with respect to resist is the same in the phase shift mask pattern for the exposure monitor mark and the mask pattern for the target pattern. Therefore, it is possible to accurately detect (or monitor) effective exposure variation with respect to thickness variation of front-end and resist films.

Figure 12:
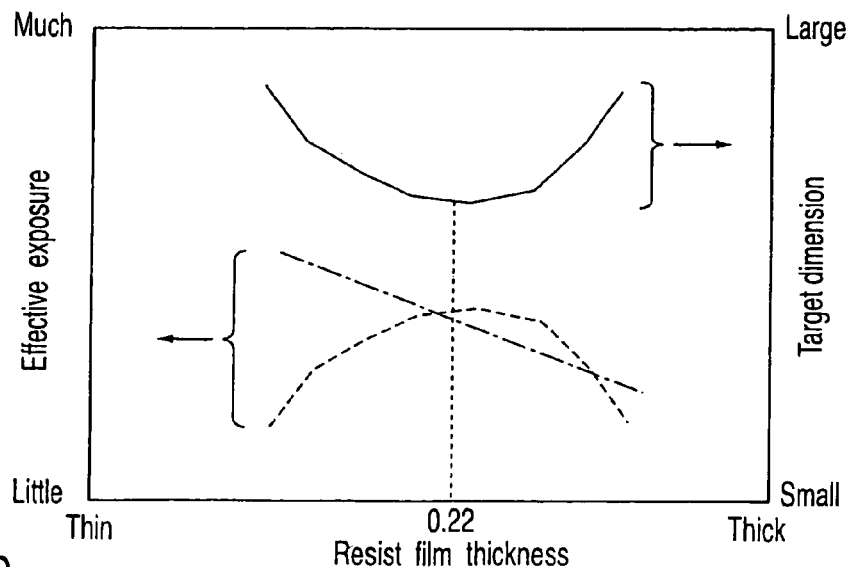
FIG. 12 is a view to explain the difference between the exposure control using the conventional mask pattern for the exposure monitor mark and the exposure control using a phase shift mask pattern for the exposure monitor mark.

FIG. 12 is a view to explain the difference between the exposure control using the phase shift mask pattern for the exposure monitor mark and the exposure control using the binary mask pattern for the exposure monitor mark. In FIG. 12, the solid line shows the dimensional variation of target pattern. On the other hand, the dotted chain ( - - - ) shows effective exposure measured using a conventional exposure monitor mask, and the broken line (— - —) shows effective exposure measured using the exposure monitor mark of the present invention. Based on FIG. 12, exposure control will be explained in detail below.

First, the exposure process was carried out under the condition that the initial film thickness of resist is set to 0.22 µm. At that time, the film thickness of resist varies due to any causes; as a result, there appears dimensional variation shown by the solid line of FIG. 12. The foregoing change is monitored using the mask pattern for the exposure monitor mark of the present invention. In this case, as seen from the broken line of FIG. 12, dimensional variation of the target pattern is monitored as effective exposure variation.

However, as illustrated by the dotted chain, when using the conventional mask pattern for the exposure monitor mark if the resist becomes thin, misjudgment is made such that the exposure should be reduced although it must be essentially increased to make small the target dimension. As a result, it can be seen that a pattern having a dimension considerably different from the target dimension is formed.

As described above, the phase shift mask pattern for the exposure monitor mark consistent with the present invention is used. By doing so, it is possible to acutely detect the effective exposure variation caused by thickness variation of resist and front-end films in alternating and phase shift mask patterns for the target pattern. Thus, highly accurate dimension control is achieved.

Figure 13:
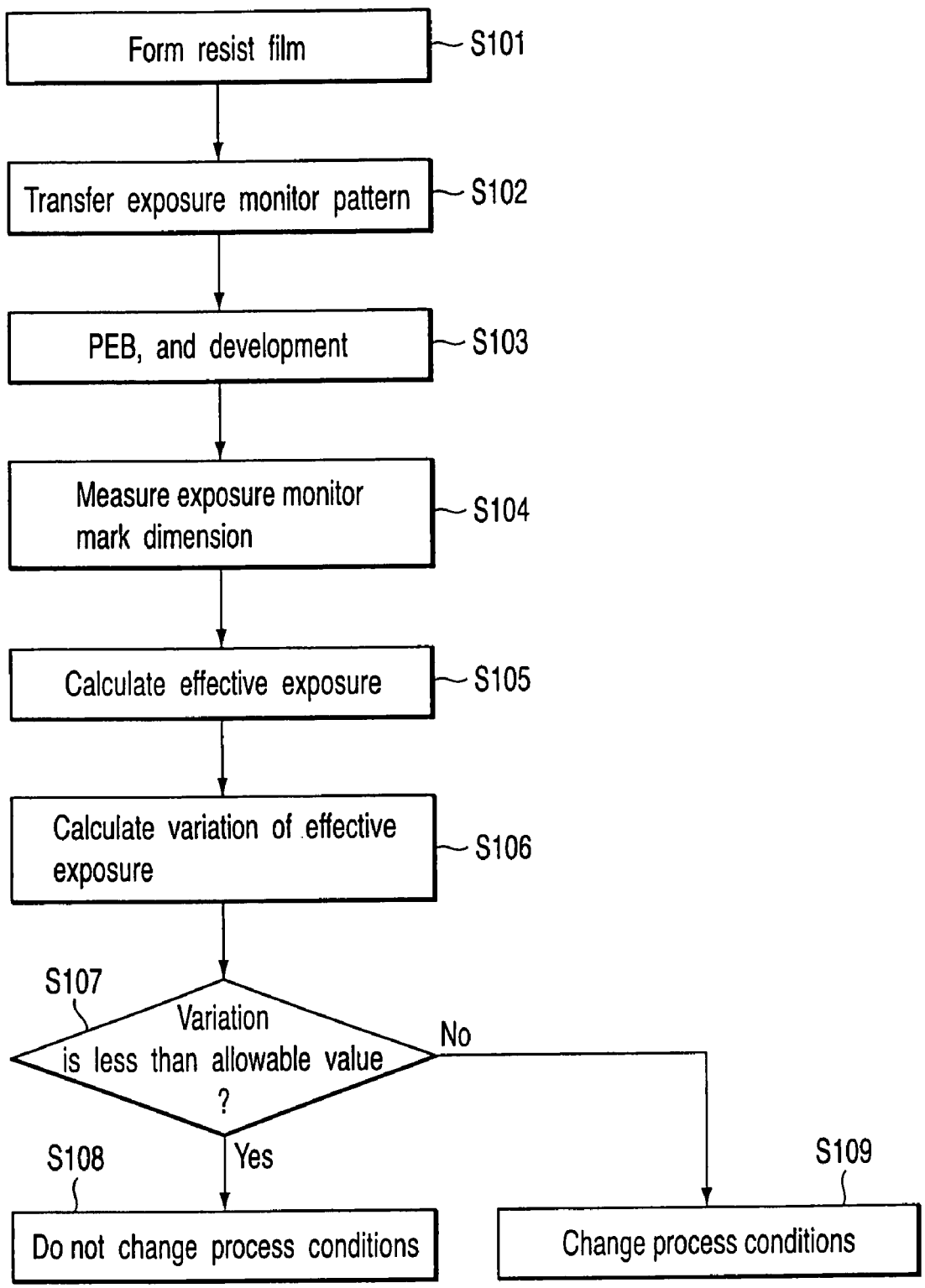
FIG. 13 is a flowchart to explain the process of manufacturing a semiconductor device according to the first embodiment.

The method of manufacturing a semiconductor device using the mask pattern for the exposure monitor mark will be explained below. FIG. 13 is a flowchart to explain the process of manufacturing a semiconductor device according to the first embodiment of the present invention.

First, a resist film is formed on a wafer (step S101). A phase shift mask pattern for the exposure monitor mark is transferred to the resist film to form a latent image of exposure monitor mark (step S102). After exposure, post exposure bake (PEB) and development are carried out to obtain an exposure monitor mark (step S103).

An inspection sample is extracted to measure the dimension of an alternating exposure monitor mark (step S104). The dimension, that is, the latent image of the exposure monitor mark may be measured after the PEB, and not the development. An effective exposure is obtained from the measured dimension (Step S105).

A variation of the effective exposure with respect to design exposure is calculated (step S106). It is determined whether or not the variation is less than an allowable value (step S107). If the variation is less than the allowable value, the next process is carried out without changing the exposure condition and the process condition after that (step S108).

If the variation is larger than the allowable value, the exposure condition and the process condition after that are changed (step S109).

The foregoing process condition after that includes exposure setting values of exposure apparatus, process time in PEB process, process temperature, development time, developer temperature or concentration. The process condition after that further includes exposure process conditions such as resist coating condition and front-end thickness condition. These conditions described above are changed in accordance with the value calculated in step S106.

The present invention is not limited to the phase shift mask pattern for the exposure monitor mark described in FIG. 1 and FIG. 2. For example, an inverted pattern of the pattern shown in FIG. 1 and FIG. 2 is applicable. FIG. 1 and FIG. 2 show the structure in which the shifter converting the phase by an angle of 180° is bonded. Any other forms are applicable so long as phase shift is made so that no zero-order diffracted light is generated with respect to the mask pattern for the exposure monitor mark. For example, even if the mask pattern for the exposure monitor mark is formed in a manner of engraving the transparent substrate, the same effect is expected.

Second Embodiment

The first embodiment has explained about micro pattern such as alternating mask pattern for the target pattern having a 190-nm pitch. For practical use, line width accuracy is required with respect to a pattern having a wider pitch.

In the second embodiment, the effective exposure relevant to thickness variation of a front-end film is accurately detected with respect to the following two patterns. One is a pattern having a pitch of 190 nm, and another is a pattern having a relatively large pitch of 460 nm although the target dimension is the same. By doing so, highly accurate CD control is achieved. The method of achieving the highly accurate CD control will be described below.

In the second embodiment, the same exposure conditions as the first embodiment are given. More specifically, an ArF excimer laser projection exposure apparatus was used. In the projection exposure apparatus, the exposure wavelength λ is 193 nm, the numerical aperture NA on the wafer is 0.68, and the coherence factor σ is 0.34. The projection exposure apparatus is provided with an alternating photomask. The pattern formed on the alternating photomask is transferred to a positive resist film on a wafer. The details of the pattern at unnecessary edge portions peculiar to the alternating type are omitted here. In brief, the pattern at unnecessary edge portions is removed by carrying out double exposure after the pattern is transferred. The following is an explanation about an example of forming two resist-remaining patterns having 190-nm and 460-nm pitches and a width of 80 nm as the target pattern dimension.

It is difficult to high accurately control mask patterns for the target pattern having different pitch. This is because the influence by standing wave effect in the foregoing two patterns is different if the thickness of the front-end film is different: For this reason, it is important whether process variation is detection and correction are immediately made if process variation with respect to resist and front-end film thickness occurs.

The present inventors have found the method given below. According to the method, effective exposure variation including standing wave effect is monitored with respect to two patterns having 190-nm and 460-nm pitches. The front-end thickness variation is detected from the relation of effective exposure variation between both monitor patterns.

The foregoing method will be explained below with reference to FIG. 14, which is a cross-sectional view showing the structure of a photomask according to the second embodiment. In the second embodiment, a binary mask pattern 400 for the exposure monitor mark is additionally provided as the exposure monitor. FIG. 14 shows the cross section of the photomask. In FIG. 14, a reference numeral 100 denotes the phase shift mask pattern for the exposure monitor mark described in the first embodiment. A reference numeral 400 denotes a binary mask pattern 400 for the exposure monitor mark, and 304 denotes a mask pattern for the target pattern having a pitch of 460 nm.

In FIG. 15, two diffracted light images are shown together. One is a diffracted light image (zero-order diffracted light) 313 on the pupil plane corresponding to the binary mask pattern 400 for the exposure monitor mark. Another is a diffracted light image 314 corresponding to the mask pattern 304 for the target pattern having a pitch of 460 nm. In FIG. 16, there are shown a diffracted light 323 of the binary mask pattern 400 for the exposure monitor mark and a diffracted light 324 of the mask pattern 304 for the target pattern (pitch: 460 nm).

As described in the first embodiment, the effective exposure of the 190 nm pitch mask pattern 302 for the target pattern is accurately detected inclusive of the front-end thickness variation using the phase shift mask pattern 100 for the exposure monitor mark. On the other hand, there is a tendency for the diffracted light 324 of the pattern 304 having a large pitch of 460 nm to focus on the center of the pupil plane 201, as seen from FIG. 15. Thus, it can be seen that the diffracted light 324 is incident onto the resist at approximately the same angle as the diffracted light 323 of the binary mask pattern 400 for the exposure monitor mark.

FIG. 17 is a characteristic chart to explain absorption dose to resist thickness in the mask pattern 400 for the exposure monitor mark and the mask pattern 304 for the target pattern having a pitch of 460 nm. A resist film, oxide film (110 nm), organic anti-reflection film (300 nm) and Si are used as the front-end, like the first embodiment. Judging from the result, the absorption dose characteristic with respect to resist is substantially the same in the mask pattern 304 for the target pattern having a pitch of 460 nm and the mask pattern 400 for the exposure monitor mark. Therefore, it is possible to accurately detect (or monitor) effective exposure variation with respect to the front-end thickness variation.

Figure 18:
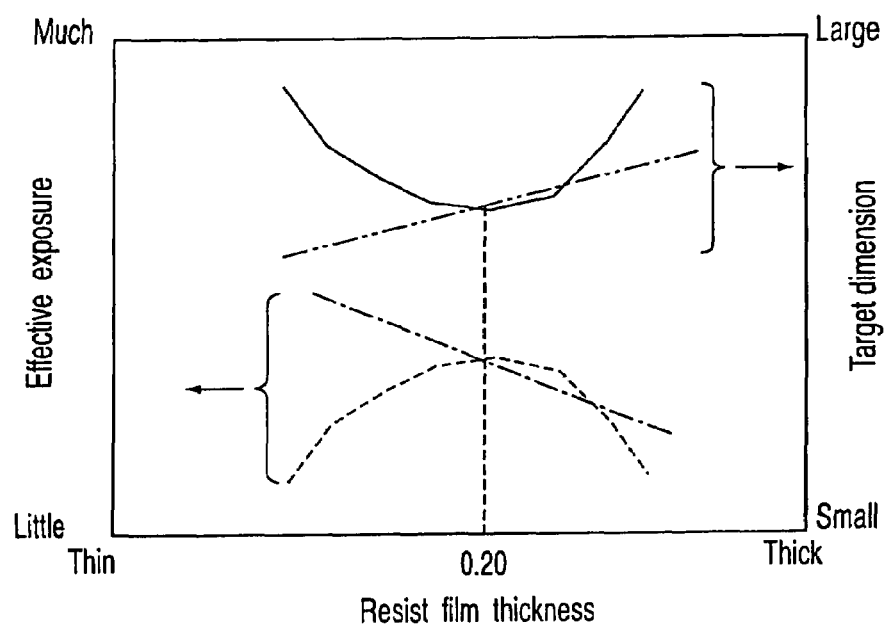
FIG. 18 is a view to explain resist film thickness variation dependency of two target pattern dimensions and resist film thickness variation dependency of effective exposure detected by two exposure monitor marks.

FIG. 18 shows resist thickness variation dependency relevant to two target pattern dimensions and resist thickness variation dependency relevant to effective exposures detected by two exposure monitor marks. In FIG. 18, the solid line (—) and the two-dotted chain line (— - - —) respectively show a mask pattern dimension for the target pattern having a pitch of 190 nm and a target pattern dimension having a pitch of 190 nm. In FIG. 18, the dotted line ( - - - ) shows an effective exposure obtained from dimension measurement using a conventional phase shift exposure monitor mark. The dotted chain line (— - —) shows an effective exposure obtained from dimension measurement of a binary exposure monitor mark consistent with the present invention.

From the result shown in FIG. 17 and FIG. 18, the inventors have interested in the following matter. The difference of influence relevant to front-end thickness variation between two target pattern dimensions having different pitches is reflected in the effective exposure variation between phase shift and conventional exposure monitor marks described in the first embodiment.

Figure 19:
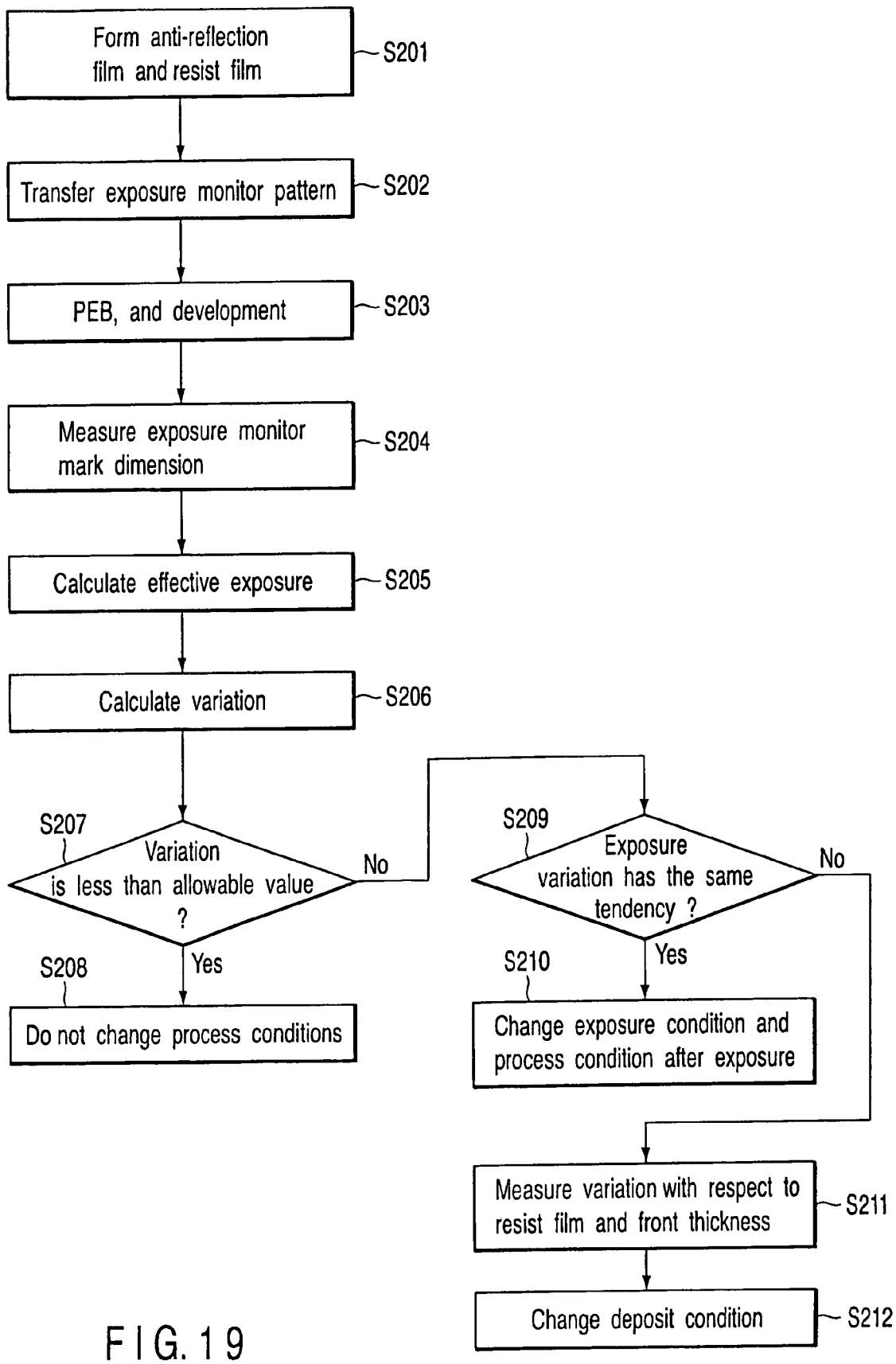
FIG. 19 is a flowchart to explain the process of manufacturing a semiconductor device according to the second embodiment.

The inventors have employed the method given below. More specifically, the effective exposure variation, in particular, resist and front-end thickness variations are immediately detected, and thereafter, the variations are fed back to resist film coating process and front-end forming process. The method will be explained below with reference to the flowchart shown in FIG. 19. First, front-end films such as oxide film and anti-reflection film are formed on a wafer (step S201). A resist film is coated on the front-end film, and bake process before exposure is carried out so that a mask pattern for the exposure monitor mark is transferred to the resist film (step S202). Post exposure bake (PEB) and development are carried out to form a pattern (step S203). An inspection sample is extracted, and each dimension of binary and alternating exposure monitor marks is measured (step S204). The dimension of exposure monitor mark may be measured after PEB or at the latent image stage after exposure, and not after development. From exposed and measured dimension, each effective exposure is calculated with respect to the foregoing two exposure monitor marks (step S205). A variation of the effective exposure to design exposure is calculated (step S206). It is determined whether or not the variation is less than an allowable value (step S207). If the variation is less than the allowable value, it is unnecessary to change exposure condition and process condition after that (step S208).

However, if the variation is larger than the allowable value, it is determined whether or not each variation of two effective exposures is the same tendency (step S209). If two effective exposures have the same tendency, it is predicted that the influence by the front-end thickness is not given or little. Therefore, corrections are made with respect to setting exposure of the exposure apparatus or PEB condition or development condition (step S210). However, if each effective exposure variation obtained from two exposure monitor marks has the same tendency, the cause is the influence by variation of resist or front-end film thickness. For this reason, even if the exposure process or the process after exposure is changed, the sufficient effect is not obtained. The variation of resist or front-end film thickness is measured (step S211), and thereafter, deposit condition of these resist or front-end film is corrected in accordance with the measured variation (step S212).

As described above, two kinds of mask patterns for the exposure monitor mark are used. By doing so, it is determined whether the variation of the obtained effective exposure results from the variation of resist and front-end film thickness or causes other than those. Therefore, feedback is possible with respect to front-end deposit process or resist coating process. In particular, high accurate dimension control is achieved with respect to several kinds of target patterns.

The resist thickness variation is given as the front-end variation. The present invention is not limited to the resist. Effective exposure variation is accurately monitored with respect to variation relevant to an oxide film or organic anti-reflection film as an other front-end, like the resist. Thus, highly accurate dimension control is achieved.

Figure 20:
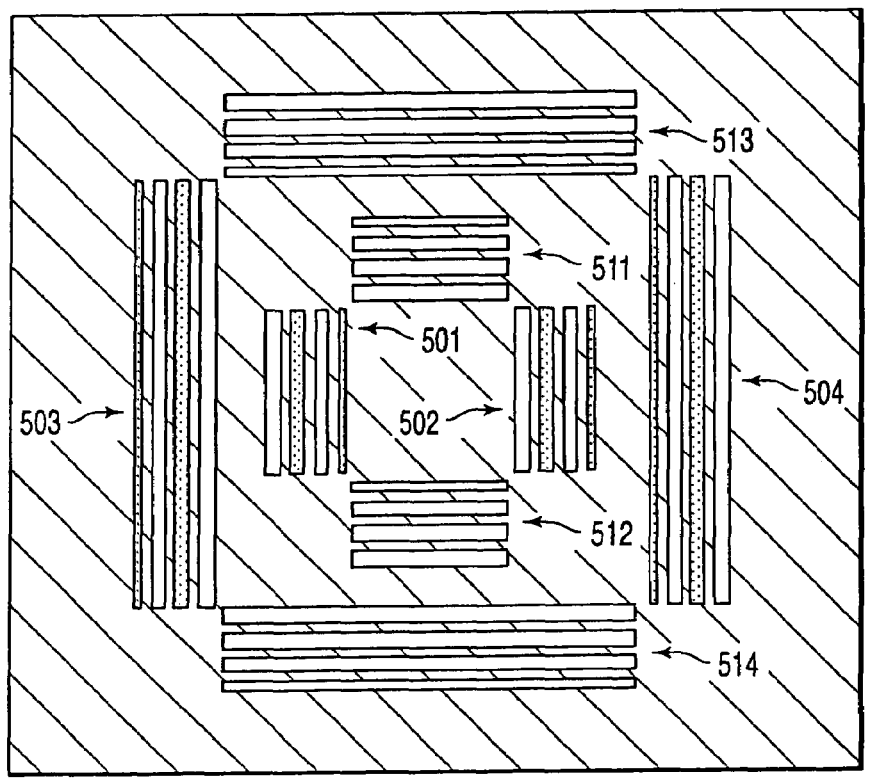
FIG. 20 is a cross-sectional view to explain the structure of the mask pattern for the exposure monitor mark according to the second embodiment.

The phase shift mask pattern for the exposure monitor mark is not limited to the structure shown in FIG. 1 and FIG. 2. For example, an inverted pattern of the pattern shown in FIG. 1 and FIG. 2 is applicable. In FIG. 2, there is shown the structure in which the shifter converting the phase by an angle of 180° is bonded. Any other forms are applicable so long as the phase shift is made so that no zero-order diffracted light is generated with respect to the mask pattern for the exposure monitor mark. For example, even if the mask pattern for the exposure monitor mark is formed in a manner of engraving the transparent substrate, the same effect is expected. The structure disclosed in U.S. Pat. No. 6,226,074 is employed, and thereby, the following arrangement is given. As shown in FIG. 20, alternating mask patterns 501 to 504 for the exposure monitor mark are arranged in the X-axis direction while binary mask patterns 511 to 514 for the exposure monitor mark are arranged in the Y-axis direction (and vice versa). In this way, effective exposure variation is detected as misalignment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    preparing a projection exposure apparatus;
    preparing a photomask which includes:
        a transparent substrate and a light shield film, the light shield film being arranged in patterns on the transparent substrate, the patterns to be transferred to a resist film formed on a wafer by the projection exposure apparatus, the patterns including:
            a circuit mask pattern for a circuit pattern to form a latent image of a predetermined circuit pattern on a resist film; and
            first and second mark mask patterns for forming an exposure monitor mark, the exposure monitor mark having dimensions which change in accordance with exposure of the resist film,
                the first mark mask pattern for the exposure monitor mark being formed in a manner wherein first blocks having a predetermined width p, which are not resolved by the projection exposure apparatus, are intermittently or continuously arrayed along one direction, and a first light shield and first light transmission portions are arrayed along one direction in each of the first blocks, the first blocks being arrayed so that a dimension ratio of the first light shield and the first light transmission portions of the first blocks simply changes and a phase difference of exposure light passing through adjacent first light transmission portions is approximately 180°, the second mark mask pattern for the exposure monitor mark being formed in a manner wherein second blocks having a predetermined width p, which are not resolved by the projection exposure apparatus, are intermittently or continuously arrayed along one direction, and a second light shield and second light transmission portions are arrayed along one direction in each of the second blocks, the second blocks being arrayed so that a dimension ratio of the second light shield and the second light transmission portions of the second blocks simply changes and a phase difference of exposure light passing through adjacent second light transmission portions is approximately 0°;

transferring the first and second mark mask patterns for the exposure monitor mark to the resist film using the projection exposure apparatus by forming each latent image of the first and second exposure monitor marks on the resist film;

measuring dimensions of the first and second exposure monitor marks obtained by developing the latent image of the first and second exposure monitor marks on the resist film;

calculating a first effective exposure based on the measured dimension of the first exposure monitor mark;

calculating a second effective exposure based on the measured dimension of the second exposure monitor mark;

comparing a variation of the calculated first effective exposure and a variation of the calculated second effective exposure to determine whether or not the variation of the calculated first effective exposure is equal to the variation of the calculated second effective exposure; and changing at least one of a deposit condition of a front-end film formed under the resist film or a resist film coating condition, if, as a result of the comparison, it is determined that the variation of the calculated first effective exposure is different from the variation of the calculated second effective exposure.

2. The method according to claim 1, wherein an optical film is formed on one of the first or second light transmission portions which are adjacent to each other, and the thickness of the optical film is adjusted so that a phase difference between an exposure light passing through one of the adjacent first or second light transmission portions and an exposure light passing through the other of the adjacent first or second light transmission portions becomes 180°.

3. The method according to claim 1, wherein the transparent substrate of one of the first or second light transmission portions which are adjacent to each other is engraved, and the engraved depth of the transparent substrate corresponding to the engraved first or second light transmission portion is adjusted so that a phase difference between an exposure light passing through one of the adjacent first or second light transmission portions and an exposure light passing through the other of the adjacent first or second light transmission portions becomes 180°.

4. The method according to claim 1, wherein when a wavelength of the exposure light of the projection exposure apparatus is set as $\lambda$, a numerical aperture of the substrate side of the projection exposure apparatus is set as NA, and a width of said one direction of a projection image corresponding to one of the first or second blocks in projecting the mask pattern for the exposure monitor mark onto the resist film using the projection exposure apparatus when a corresponding pitch is set as $P_1$, the following relation is given:

$$P_1 \leq \lambda/2NA.$$

5. The method according to claim 1, wherein at least one of a setting exposure of the projection exposure apparatus, a post-exposure bake (PEB) condition, or a development condition is corrected, if, as a result of the comparison, it is determined that tendencies of the variations of the calculated first and second effective exposures are the same.

* * * * *